(12) United States Patent
Wang et al.

(10) Patent No.: US 7,832,416 B2
(45) Date of Patent: Nov. 16, 2010

(54) IMPRINT LITHOGRAPHY APPARATUS AND METHODS

(75) Inventors: Shih-Yuan Wang, Palo Alto, CA (US); Wei Wu, Mountain View, CA (US); Zhaoning Yu, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 993 days.

(21) Appl. No.: 11/539,936

(22) Filed: Oct. 10, 2006

(65) Prior Publication Data

US 2008/0145773 A1    Jun. 19, 2008

(51) Int. Cl.
*B08B 3/04* (2006.01)
(52) U.S. Cl. ............... 134/61; 134/63; 134/94.1; 425/385; 425/387.1
(58) Field of Classification Search ............. 134/61, 134/63, 44, 94.1, 104.1, 201; 425/385, 387.1, 425/388
See application file for complete search history.

(56) References Cited

U.S. PATENT DOCUMENTS

| | | | |
|---|---|---|---|
| 5,772,905 A | 6/1998 | Chou | |
| 6,536,452 B1 * | 3/2003 | Kohama et al. | 134/117 |
| 6,579,742 B2 | 6/2003 | Chen | |
| 6,805,054 B1 | 10/2004 | Meissl et al. | |
| 6,900,881 B2 | 5/2005 | Sreenivasan et al. | |
| 6,929,762 B2 | 8/2005 | Rubin | |
| 6,980,282 B2 | 12/2005 | Choi et al. | |
| 2004/0090605 A1 | 5/2004 | Yogev | |
| 2004/0149367 A1 | 8/2004 | Olsson et al. | |
| 2005/0116370 A1 * | 6/2005 | Ogino et al. | 264/40.1 |
| 2005/0124092 A1 | 6/2005 | Bona et al. | |
| 2006/0072085 A1 | 4/2006 | Compen et al. | |
| 2006/0132732 A1 | 6/2006 | Kuit | |

FOREIGN PATENT DOCUMENTS

| | | |
|---|---|---|
| WO | WO03/005124 | 1/2003 |
| WO | WO 2004/013693 A2 | 2/2004 |
| WO | WO2005/026837 | 3/2005 |
| WO | WO 2005/026837 A3 | 3/2005 |
| WO | WO 2005/109095 A2 | 11/2005 |
| WO | WO 2006/020194 A2 | 2/2006 |

* cited by examiner

*Primary Examiner*—Michael Kornakov
*Assistant Examiner*—Ryan Coleman

(57) ABSTRACT

An imprint lithography apparatus including a service station.

11 Claims, 10 Drawing Sheets

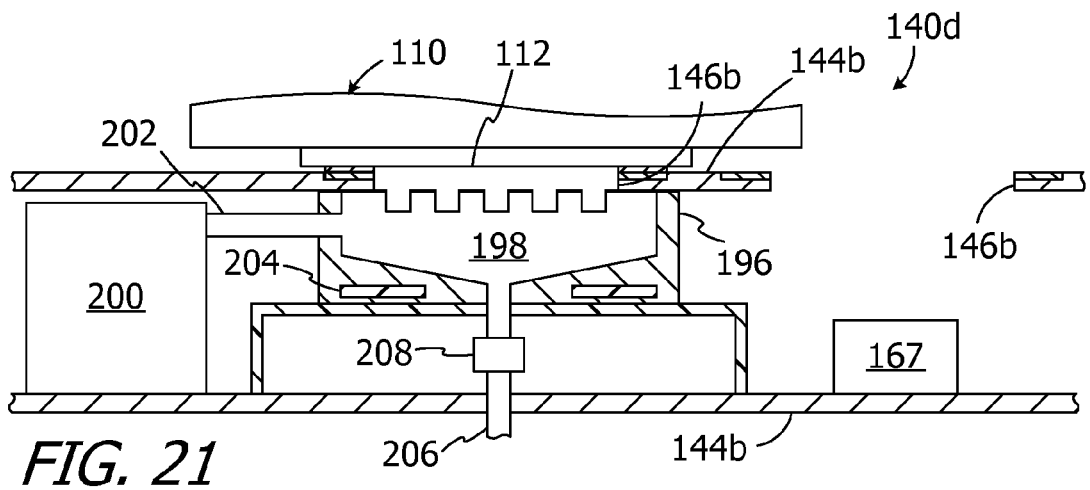
FIG. 21
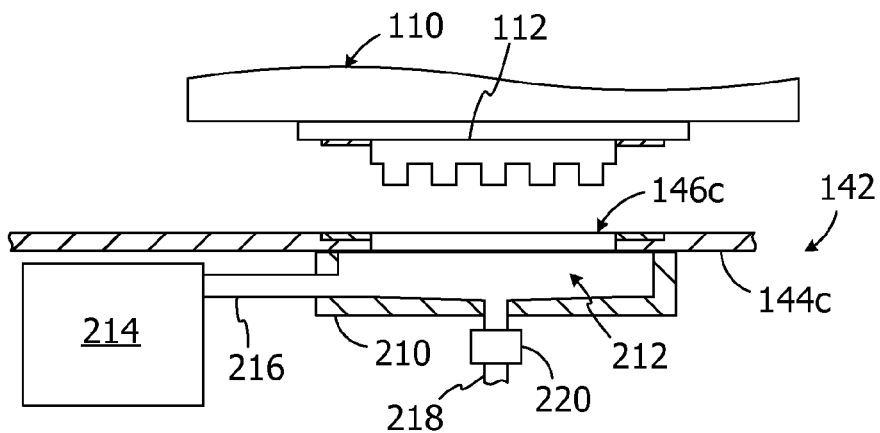
FIG. 22
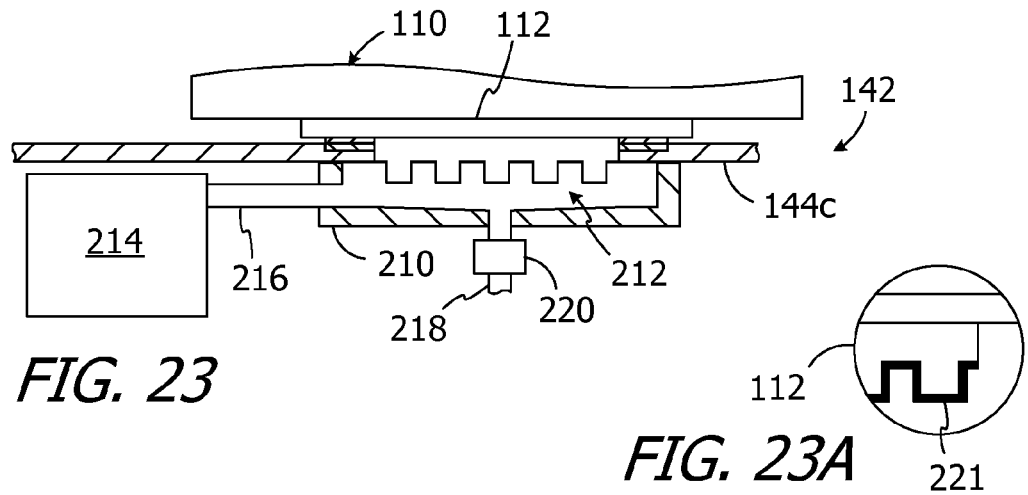
FIG. 23
FIG. 23A

IMPRINT LITHOGRAPHY APPARATUS AND METHODS

BACKGROUND OF THE INVENTIONS

Imprint lithography processes are capable of forming structures that are 100 nanometers or less in size and have been used to manufacture devices that include, but are not limited to, microelectronic devices (e.g. integrated circuits), magnetic storage devices, mechanical systems, micro-electro-mechanical systems, optical devices and biological testing devices. Imprint lithography involves the formation of a relief pattern in material that is carried on the surface of a substrate. More specifically, in one type of imprint lithography process, a template with a relief pattern (or "mold") is brought into contact with a material on a substrate that is in liquid form at room temperature, or that is liquefied by heating. The liquid material fills the template and assumes the shape of the relief pattern. The material is then subjected to conditions that cause the material to solidify and the patterned template is removed. A structure (or "layer") in the shape of the relief pattern will then remain on the substrate. In order to facilitate removal, the patterned template may be coated with a release agent. This process may be repeated on different portions of the substrate with the same template in what is referred to as a step and repeat process. This process may also be repeated on the same portion(s) of the substrate with the same template to form multi-layer structures. Etching may be used to remove portions of the patterned material in some or all of the layers.

Although imprint lithography apparatus and methods have proven to be quite useful, especially in the area nanometer-sized structures, the present inventors have determined that they are susceptible to improvement. For example, the present inventors have determined that use of the imprint lithography apparatus and methods available heretofore can result in structural defects caused by liquid material residue and particles that can remain on the patterned template after removal, as well as by the degradation of the release agent coating on the patterned template.

BRIEF DESCRIPTION OF THE DRAWINGS

Detailed description of embodiments of the inventions will be made with reference to the accompanying drawings.

FIG. 21 is a side, partial section view of a cleaning station in accordance with one embodiment of a present invention.

FIGS. 22 and 23 are side, partial section views of a release agent re-supply station in accordance with one embodiment of a present invention.

FIG. 23A is an enlarged view of a portion of a patterned template with a release agent layer.

DETAILED DESCRIPTION OF THE EMBODIMENTS

The following is a detailed description of the best presently known modes of carrying out the inventions. This description is not to be taken in a limiting sense, but is made merely for the purpose of illustrating the general principles of the inventions. It is noted that detailed discussions of aspects of imprint lithography systems and methods that are not required for the understanding of the present inventions, such as the specific characteristics of the imprint head, motion stage and control systems, have been omitted for the sake of simplicity. The present inventions are also applicable to a wide range of imprint lithography systems and methods, including those presently being developed or yet to be developed. For example, although the present inventions are primarily described below in the context of UV-curable imprint lithography, the present inventions are also applicable to thermal imprint lithography.

Figure 1:
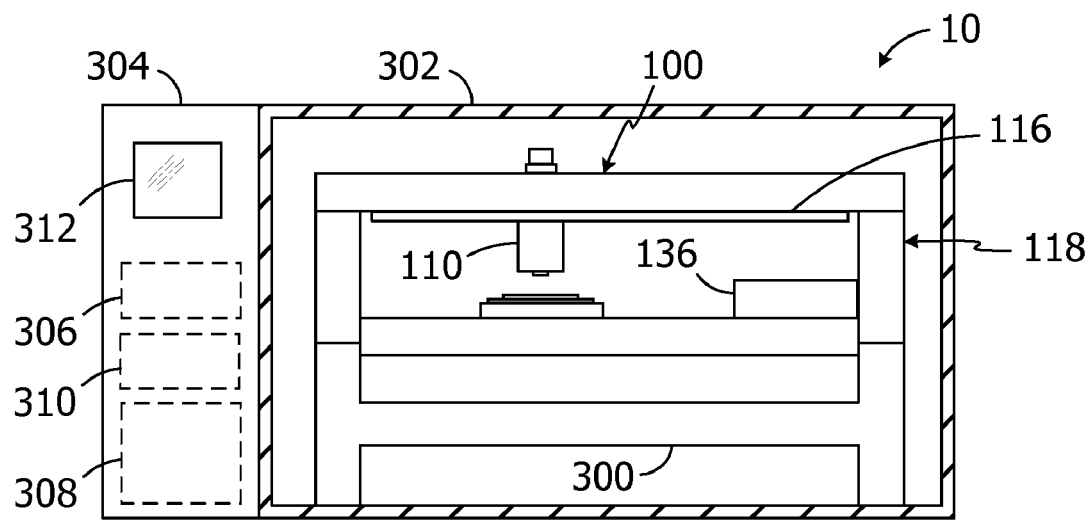
FIG. 1 is a front, partial section view of an imprint lithography system in accordance with one embodiment of a present invention.

One example of an imprint lithography system in accordance with a present invention is generally represented by reference numeral 10 in FIG. 1. The exemplary system 10 includes an imprint lithography apparatus 100 that is mounted on a support table 300 within an apparatus enclosure 302. An electronics enclosure 304 houses a system controller 306, a temperature control apparatus 308, which maintains the interior of the apparatus enclosure 302 at the desired temperature, a power supply 310 and a user interface 312. Specific examples of imprint lithography systems that may be modified so as to embody the present inventions include the Imprio® imprint lithography systems available from Molecular Imprints, Inc. in Austin, Tex.

Figure 2:
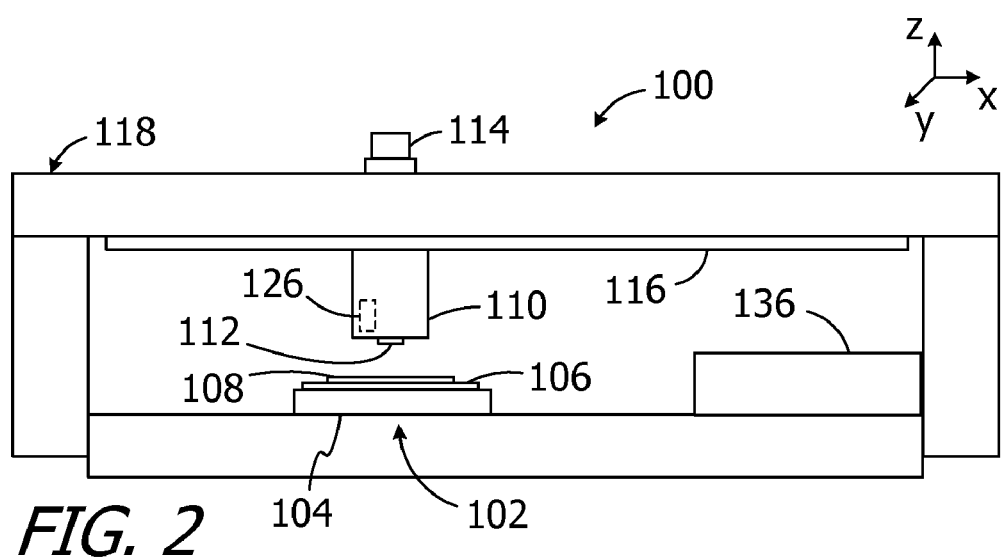
FIG. 2 is a front view of an imprint lithography apparatus in accordance with one embodiment of a present invention.
Figure 3:
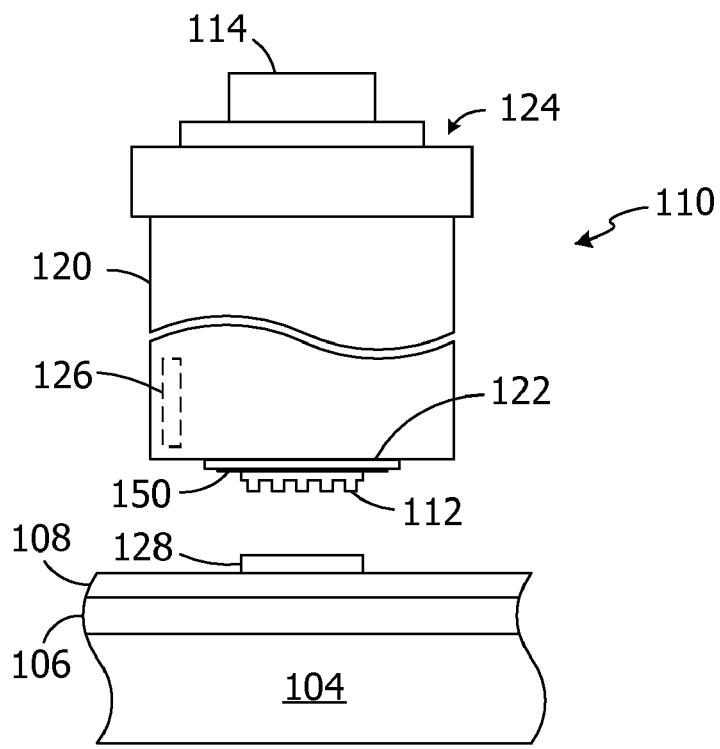
FIGS. 3-6 are side views of a patterned layer being formed on a substrate.

Turning to FIG. 2, the exemplary imprint lithography apparatus 100 includes a stationary substrate support 102, which has a base 104 and substrate chuck 106 that holds a substrate 108, and an imprint head 110 that moves in the z-direction and carries a patterned template 112 and a radiation source 114. The imprint head 110 is coupled to a motion stage 116 that moves in the x and y-directions relative to a support apparatus 118 that mechanically connects the substrate support 102 to the motion stage. The substrate support 102 may, in some alternative implementations, also be configured to move the substrate chuck 106 in any one, any two, or all three of the x, y, and z-directions. Referring to FIG. 3, and although the present inventions are not limited to any particular type of imprint head, the exemplary imprint head 110 includes a main housing 120, an orientation apparatus 122 that secures the patterned template 112 to the main housing and orients it relative to the main housing, and a z-direction movement apparatus which is generally represented by reference numeral 124 and is secured to the motion stage 116. A liquid dispenser head 126, which is connected to a source of curable liquid (not shown), is carried within the imprint head 110 in the illustrated embodiment and used to deposit curable liquid onto the substrate 108. Alternatively, the curable liquid may be spin coated onto the substrate 108 on the imprint lithography apparatus itself, or on a separate machine.

Although the present inventions are not limited to any particular curable liquids, suitable curable liquids include, for example, low viscosity light curable monomer liquids. A monomer and photoinitiator combination, such as those found in commercially available UV curable imprint resist, is one example thereof. The configuration of the radiation source 114 depends on the type of curable liquids that will be employed. If, for example, the curable liquids are UV curable liquids, then the radiation source 114 will be configured to emit UV radiation, as it is in the illustrated embodiment. Additionally, and although the present inventions are not limited to any particular type of patterned template, the exemplary patterned template 112 may be formed from material, such as glass, that is at least partially transparent, i.e. transparent enough to allow UV radiation from the radiation source 114 to cure the curable liquid 128. Alternative embodiments may be configured such that a radiation source 114 is positioned below the substrate 108. Here, an at least partially transparent substrate would be employed.

Figure 4:
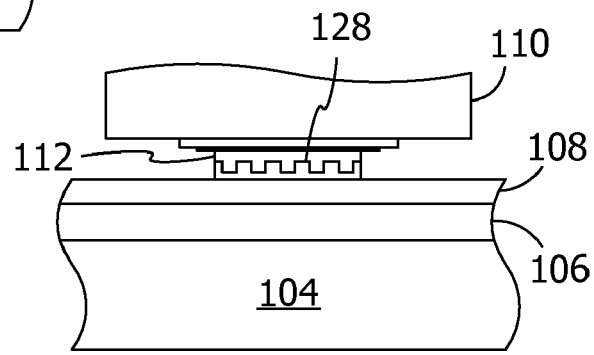
Figure 5:
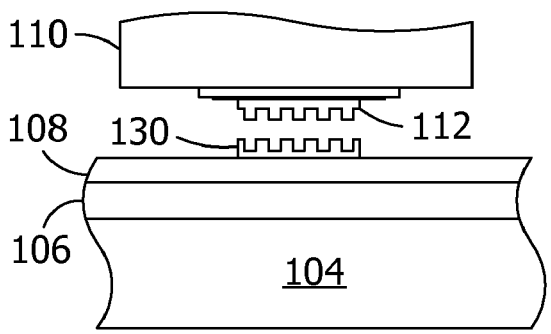
Figure 6:
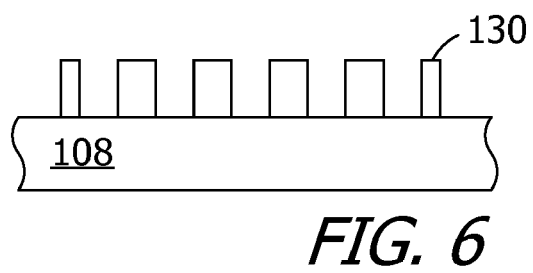

Generally speaking, an exemplary imprint process proceeds in the manner illustrated in FIGS. 3-6. A volume of curable liquid 128 is deposited onto the substrate 108. The volume of curable liquid 128 may be a continuous film, as shown, or a plurality of adjacent beads. In either case, the patterned template 112 and curable liquid 128 are then brought into alignment with one another (FIG. 3) and, thereafter, into contact with the one another (FIG. 4). The curable liquid 128, which will conform to the shape of the patterned template 112, may be cured by activating the radiation source 114. The radiation source 114 directs UV radiation through the patterned template 112 and into the curable liquid 128 until the liquid is solidified. The patterned template 112 is then removed (FIG. 5). The result is a solid layer 130 with a pattern that is complementary to the patterned template 112. Portions of the patterned solid layer 130 may be removed (FIG. 6) by etching or other suitable processes and/or additional patterned solid layers may be formed over the patterned solid layer 130. The steps illustrated in FIGS. 3-6 may also be repeated on a plurality of regions of the substrate 108 in a "step and repeat" process.

Figure 7:
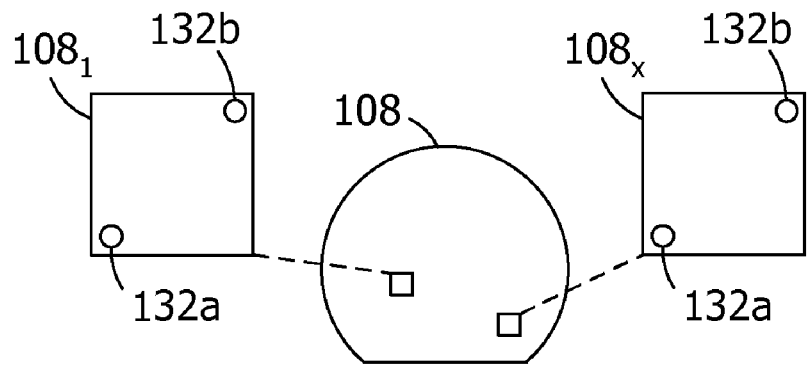
FIG. 7 is a plan view of an exemplary substrate.
Figure 8:
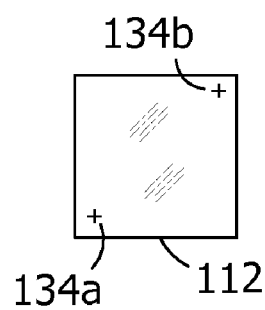
FIG. 8 is a rear view of an exemplary patterned template.

One important aspect of any imprint lithography process is the alignment of the substrate 108 relative to the patterned template 112. Correct alignment of the substrate 108 and the patterned template 112 is necessary in order to locate the patterned layer on the intended region of the substrate and to achieve proper alignment of a patterned layer with any previously formed patterned layers. Accordingly, and referring to FIGS. 7 and 8, the exemplary imprint lithography system 10 defines a plurality of substrate regions $108_{1-x}$ on the substrate 108 where the pattern associated with the patterned template 112 will be recorded. Each substrate region $108_{1-x}$ includes a pair of fiducial reference marks 132a and 132b in, for example, the form of an "o" at opposing corners the region. The exemplary template 112 has a corresponding pair of alignment marks 134a and 134b in, for example, the form of a "+" at opposing corners of the template. Machine vision apparatus (not shown) may be used to determine when the template 112 is aligned with a particular substrate region $108_{1-x}$, as evidenced by the alignment marks 134a and 134b on the template being superimposed within the fiducial reference marks 132a and 132b associated with that substrate region.

Figure 9:
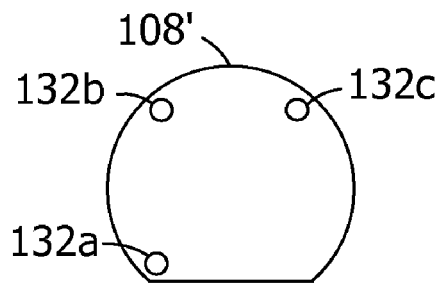
FIG. 9 is a plan view of an exemplary substrate.

It should be noted that the above-described alignment method, which is commonly used in step and repeat processes, is merely one exemplary alignment method and that the present inventions are not limited to any particular alignment method. For example, as illustrated in FIG. 9, a substrate 108' includes three fiducial reference marks 132a-c that are used to align the entire substrate, as opposed to a particular substrate region, with a template. This type of alignment may be used in whole wafer imprint processes.

The present inventors have determined that structural defects in a patterned solid layer 130 can be caused by curable liquid residue and/or solidified curable liquid particles (collectively "curable liquid residue") that remains on the patterned template 112 after a previous patterned solid layer has been formed and the template is removed therefrom. More specifically, curable liquid residue that remains on the patterned template 112 may cause structural defects when the patterned template is subsequently used to form patterned solid layers 130 in other volumes of curable liquid 128 during, for example, a step and repeat process where the patterned template 112 moves from one volume of curable liquid 128 to the next.

It has also been determined that the coating (or "layer") of release agent on the portion of the patterned template 112 that comes into contact with curable liquid 128 may degrade as the patterning processes is repeated. This phenomenon, which appears to be due to a loss of fluorine atoms, is discussed in "Adhesion Between Template Materials and UV-Curable Nanoimprint Resists," Houle et al., Advances in Resist Technology and Processing XXIII, Proc. of SPIE Vol. 6153, 61531B (2006). As a result, the curable liquid 128 (or solidified particles thereof) may stick to the patterned template 112 as it is removed from a patterned solid layer 130. Such sticking may cause structural defects in the patterned solid layer 130 being currently formed and, as a result of curable liquid residue that remains on the patterned template, in subsequent patterned solid layers.

As illustrated for example in FIGS. 1 and 2, the exemplary imprint lithography apparatus 100 is provided with a template service apparatus 136 that may be used to perform any one, any two or all three of the following service station functions: (1) analyzing the patterned template 112 to determine whether the patterned template requires cleaning and/or a new layer of release agent, (2) cleaning the patterned template, and (3) coating the patterned template with release agent. In other words, to perform these functions, the imprint lithography apparatus 100 includes means for servicing the patterned template while the patterned template is carried by the imprint head 110. By way of example, the means for servicing the patterned template while the patterned template is carried by the imprint head includes the template service apparatus 136. Cleaning and coating the patterned template may be collectively referred to as treating the patterned template. The template service apparatus 136 in the illustrated embodiment is carried by a portion of the imprint lithography apparatus (e.g. the support apparatus 118) and is offset from the stationary substrate support 102 in one or both of the x and y-directions. In one embodiment, the imprint lithography apparatus 100 includes means for bringing together the imprint head and the means for servicing the patterned template. By way of example, the means for bringing together the imprint head and the means for servicing the patterned template includes the motion stage 116. The motion stage 116 is used to move the imprint head 110 to the template service apparatus 136 so that the patterned template 112 may be serviced while it remains on the imprint head. In other implementations, such as where the substrate support 102 is configured to move the substrate chuck 106 in any one, any two, or all three of the x, y, and z-directions and the imprint head moves only in the z-direction because it is not carried by an x-y motion stage, the substrate support may be used to support a template service apparatus and move it into, and out of, alignment with the patterned template 112 as necessary so that the patterned template may be serviced while it remains on the imprint head.

Figure 10:
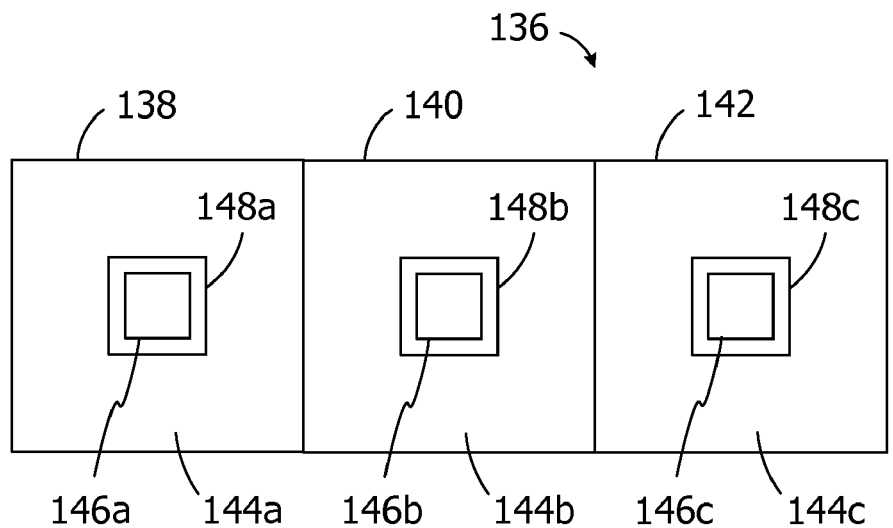
FIG. 10 is a top view of a template service apparatus in accordance with one embodiment of a present invention.
Figure 11:
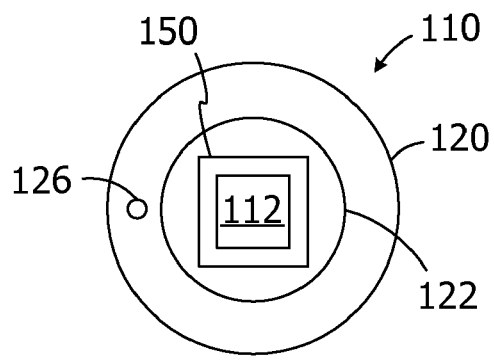
FIG. 11 is a bottom view of an imprint head in accordance with one embodiment of a present invention.
Figure 12:
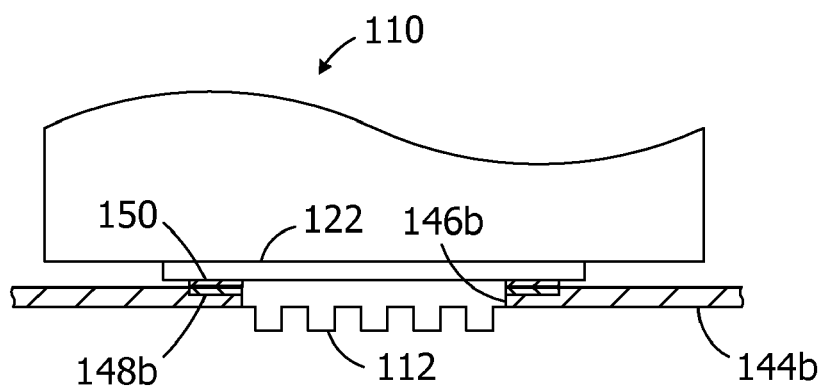
FIG. 12 is a side, partial section view of an imprint head and a portion of the template service apparatus illustrated in FIG. 10.
Figure 13:
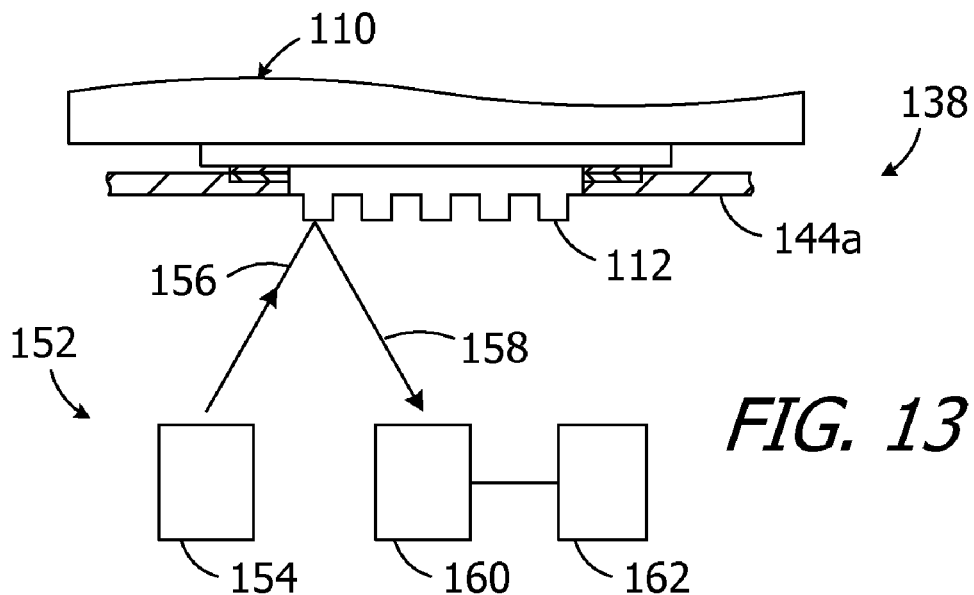
FIG. 13 is a side, partial section view of an analysis station in accordance with one embodiment of a present invention.

Turning to FIGS. 10-12, the exemplary template service apparatus 136 includes an analysis station 138, a cleaning station 140 and a release agent re-supply station 142. The stations 138-142 include respective housings 144a-c with template openings 146a-c and seals 148a-c that surround the template openings. The housings 144a-c are sealed but for the template openings 146a-c and any access discussed below. A corresponding seal 150, which is carried by the imprint head 110 and surrounds the patterned template 112, is configured to mate with the seals 148a-c when the imprint head is positioned in the manner illustrated in FIG. 12. For example, the seal 150 may be carried by the imprint head orientation apparatus 122. The stations 138-142 are aligned in the x-direction in the illustrated embodiment. The stations may, alternatively, be aligned in the y-direction, aligned diagonally, arranged in an L-shape, or separated from one another and located at various locations within the imprint lithography apparatus 100. Additionally, any two of the stations 138-142 (including all of the embodiments described below), or all three of the stations, may be combined into a single station that performs the functions of the associated two, or three, stations 138-142. For example, the cleaning station 140 and release agent re-supply station 142 may be combined into a single station.

Various specific examples of analysis stations, cleaning stations and release agent re-supply stations are described below with reference to FIGS. 13-25. The overall operation of the service apparatus is described below with reference to FIG. 26.

Although the present inventions are not limited to any particular apparatus for, or method of, analyzing the patterned template 112, the exemplary analysis station 138 employs an optical system 152 (FIG. 13) capable of identifying the presence of curable liquid residue and/or particles on the patterned template as well as measuring the state of the release agent coating on the patterned template. As used herein, "state" refers to the amount of degradation (or lack of degradation) of the release agent as compared to newly applied release agent. For example, the amount of a particular element in the release agent that is representative of the state of the release agent (e.g. fluorine) may be measured. The amount of the particular element that is lost during use is correlated to the amount of degradation of the release agent. The actual thickness of the release agent layer may (or may not) decrease as a result of this degradation. In other implementations, separate optical systems and/or non-optically based systems may be provided for the identification and/or measurement tasks.

Referring first to curable liquid residue, the exemplary optical system 152 is configured to perform specular spectroscopic scatterometry in the manner described in "Specular Spectroscopic Scatterometry in DUV Lithography," Xinhui Niu et al., IEEE Transactions on Semiconductor Manufacturing, Vol. 14, Iss. 2, pp. 97-111 (May 2001). Briefly, scatterometry is a method by which the spectral response, or "optical signature," of a periodic structure is measured. The signature can be obtained by measuring the optical properties of the structure (e.g. reflectance) as a function of one or more light parameters (e.g., the angle of incidence and/or wavelength). The angle is fixed in specular spectroscopic scatterometry. The measured signature is then compared to the expected signature, which is stored in a signature library. By comparing the measured signature to the expected signature, the system can determine whether or not curable liquid residue remains on the patterned template 112.

To that end, the exemplary optical system 152 includes an electromagnetic radiation source 154 (e.g. a helium-neon laser) that generates a light beam 156 at a fixed angle and multiple wavelengths during specular spectroscopic scatterometric processes. The diffraction responses 158 are measured by a sensor 160 (e.g. a CCD sensor when a light beam is employed) and the measured signal is analyzed by a dedicated processor 162 which has access to the signature library. The processor 162 is, in turn, connected to the system controller 306 (FIG. 1). Alternatively, the sensor 160 may simply be connected to the system controller 306, and the system controller will perform the function of comparing the diffraction response signatures to the signatures in the signature library.

With respect to the manner in which the state of the release agent on the patterned template 112 is measured, the state of the release agent layer may be measured, for example, through the use of spectroscopic ellipsometry. The optical system 152 may also be used for these measurements techniques. Here, however, the electromagnetic radiation source 154 will generate light beams 156 at multiple angles and multiple wavelengths. The diffraction responses 158 are measured by the sensor 160. The measured signals may be analyzed by a dedicated processor 162, which has access to an appropriate signature library and is connected to the system controller 306, or may be simply analyzed by the system controller 306 itself.

Fourier transform infrared ("FT-IR") spectroscopy may also be used to measure the state of the release agent. Here, the radiation source 154 will direct IR radiation (fixed angle, multiple wavelengths) at the patterned template 112. Some of the IR radiation will be absorbed by the release agent, both before and after it is reflected by the patterned template 112, and some of it will pass through. The IR radiation that passes through is measured by the sensor 160 and analyzed by a dedicated processor 162, which has access to an appropriate signature library, or by the system controller 306 itself.

Figure 14:
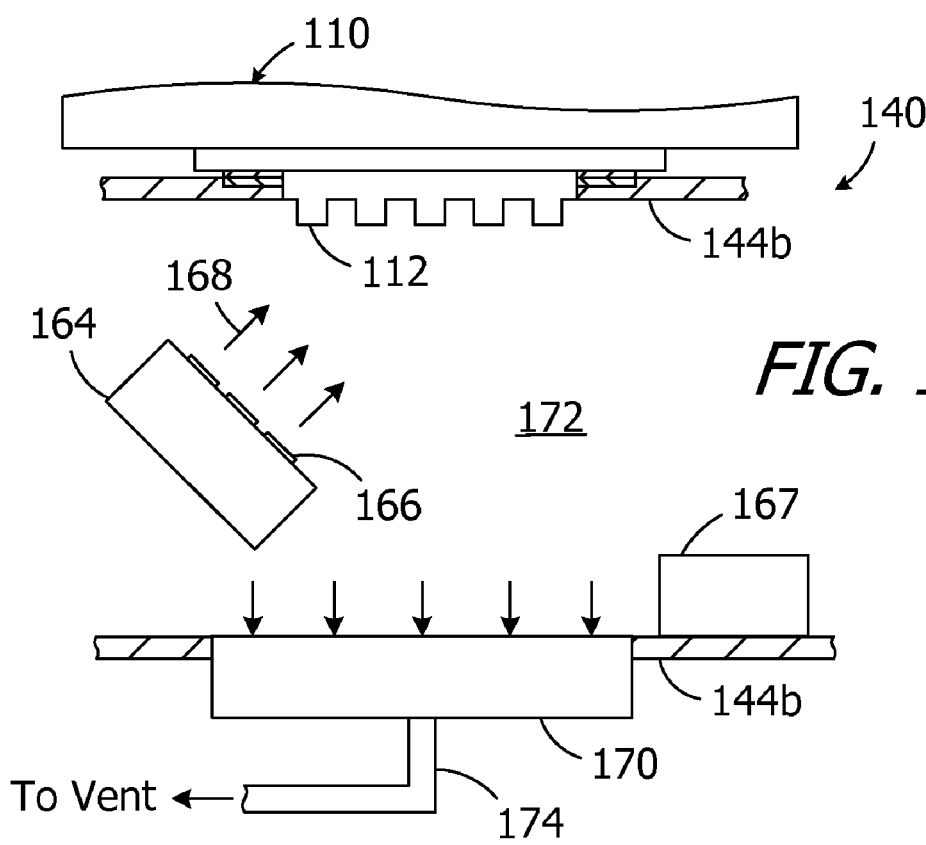
FIG. 14 is a side, partial section view of a cleaning station in accordance with one embodiment of a present invention.

Although the present inventions are not limited to any particular apparatus for, or method of, cleaning the patterned template 112, the exemplary cleaning station 140 illustrated in FIG. 14 employs fluidic forces to dislodge curable liquid residue from the patterned template. To that end, the exemplary cleaning station 140 includes a nozzle-based cleaning device 164 with a plurality of nozzles 166 that spray a cleaning substance 168 at the patterned template 112. Suitable substances include, but are not limited to, gasses such as nitrogen, solvents such as isopropyl alcohol, and super critical carbon dioxide (i.e. dry ice). The nozzles 166 in the illustrated embodiment are oriented at approximately 45 degrees relative to the patterned template 112. This orientation may, however, vary from 0 degrees to 90 degrees as applications require. The exemplary cleaning station 140 is also provided with a suction device 170 that draws the curable liquid residue removed from the patterned template 112, as well as used cleaning substance 168, from the interior 172 of the cleaning station housing 144b. This material is then transferred out of the apparatus enclosure 302 (FIG. 1) by way of a vent line 174.

The exemplary cleaning station 140 illustrated in FIG. 14 may also be provided with an apparatus that removes release agent from the patterned template 112. Typically, release agent removal will occur after it has been determined that the state of the release agent is such that re-supply is required. Although the present inventions are not limited to any particular apparatus, the exemplary cleaning station 140 employs an oxygen plasma source 167 to remove release agent from the patterned template 112. A water plasma source is another example of an apparatus that may be used to remove release agent from the patterned template 112.

Figure 15:
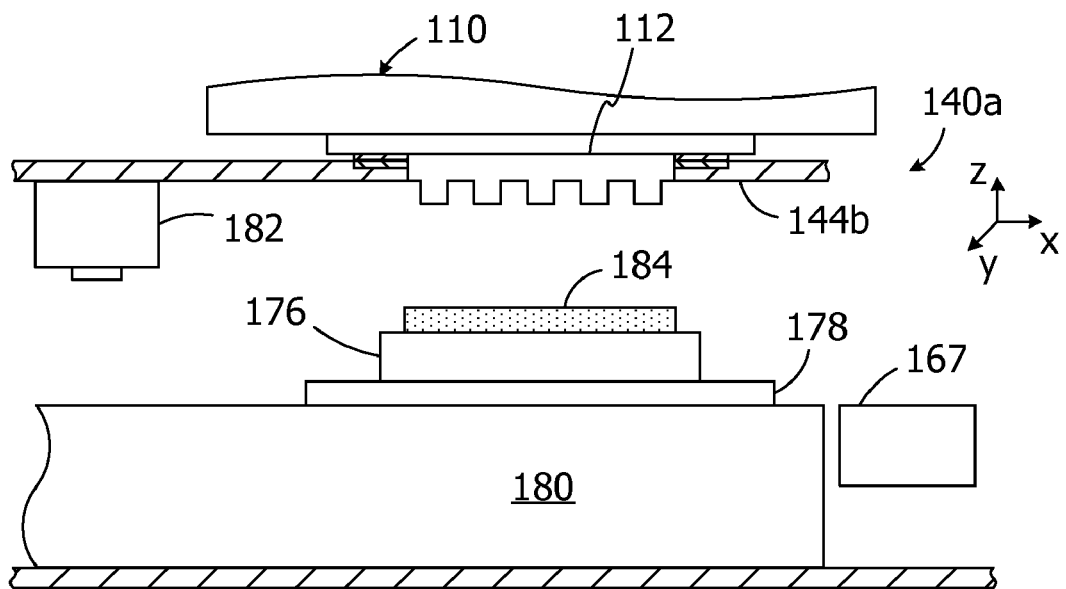
FIGS. 15-17 are side, partial section views of a cleaning station in accordance with one embodiment of a present invention.
Figure 16:
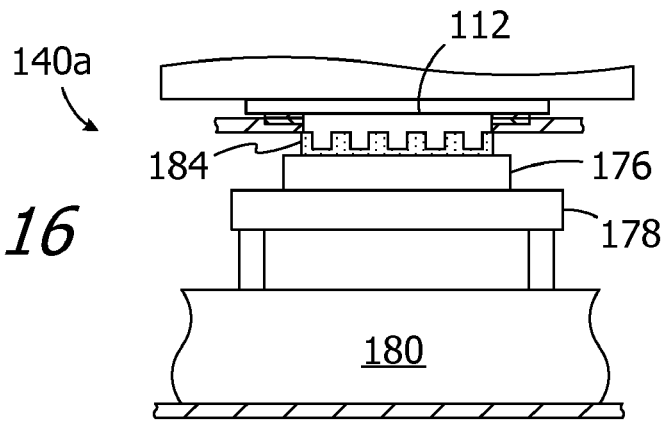
Figure 17:
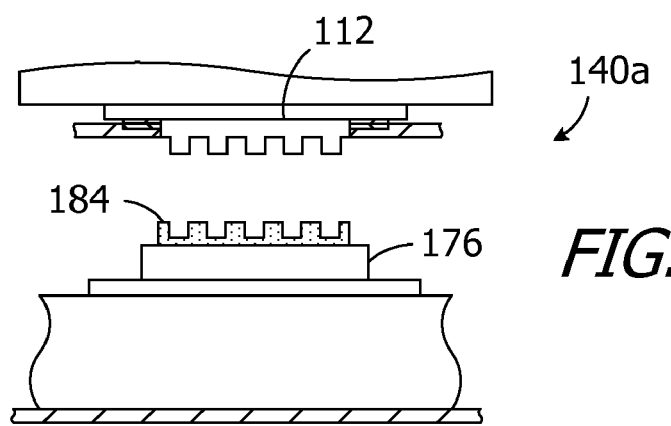

Another exemplary cleaning station that may be incorporated into a template service apparatus is generally represented by reference numeral 140a in FIGS. 15-17. The cleaning station 140a removes curable liquid residue from the patterned template 112 with adhesive forces. More specifically, in the exemplary embodiment, the cleaning station 140a includes a substrate 176 (e.g. a glass or metal substrate), that is secured to a chuck 178 on a motion stage 180, and a heated source 182 of material 184 that will solidify at room temperature. One example of such material is nanoimprint resist, such as poly methyl methacrylate (PMMA), that will become a high viscosity liquid at about 105° C. As described in greater detail below, the material 184 will be brought into contact with the patterned template 112 in a liquid state and allowed to cool to until it solidifies. The curable liquid residue on the patterned template 112 will stick to the solidified material 184 such that, when the substrate 176 and solidified material are pulled away, the curable liquid residue will be pulled from the patterned template. An oxygen plasma source 167 (or water plasma source) may also be provided to remove release agent from the patterned template 112.

More specifically, as illustrated for example in FIG. 15, the motion stage 180 will position the substrate 176 below the patterned template 112 after the heated source 182 has deposited the material 184 onto the substrate. The temperature within the cleaning station housing 144b will be at least about 170° C. so that the material remains in a liquid state. A heater (not shown) may be provided for this purpose. Next, as illustrated in FIG. 16, the motion stage 180 will then move the chuck 178 upwardly until the material 184 on the substrate 176 is in contact with the patterned template 112. The temperature within the cleaning station housing 144b will then be reduced to about 25° C. so that the material 184 will solidify. When the material 184 solidifies, curable liquid residue on the patterned template 112 will stick to the solidified material. The motion stage 180 will then lower the chuck 178 and substrate 176 (FIG. 17) so that the solidified material 184 peels off the patterned template 112 and takes the curable liquid residue with it. The release agent, if any, on the patterned template 112 will facilitate curable liquid residue removal because the curable liquid residue will be more likely to stick to the solidified material 184 than the patterned template.

Thereafter, the substrate 176, with the solidified material 184 and curable liquid residue adhered thereto, may removed from the cleaning station housing 144b and replaced by a clean substrate. Alternatively, the solidified material 184 and curable liquid residue may be removed from the substrate 176 by a heating/scraping apparatus (not shown) so that the substrate 176 can be re-used.

It should also be noted that the cleaning station 140a may be reconfigured such that the substrate 176 is not moved in the z-direction. Here, the motion stage 116 will move the imprint head 110 and bring the patterned template 112 into contact with the liquefied material 184. The motion stage 116 will also be used to pull the patterned template 112 away from the solidified material 184.

Figure 18:
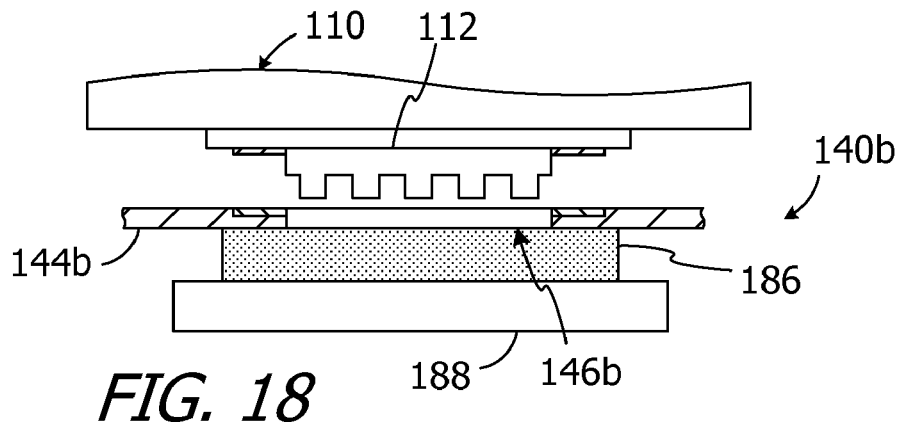
FIGS. 18 and 19 are side, partial section views of a cleaning station in accordance with one embodiment of a present invention.
Figure 19:
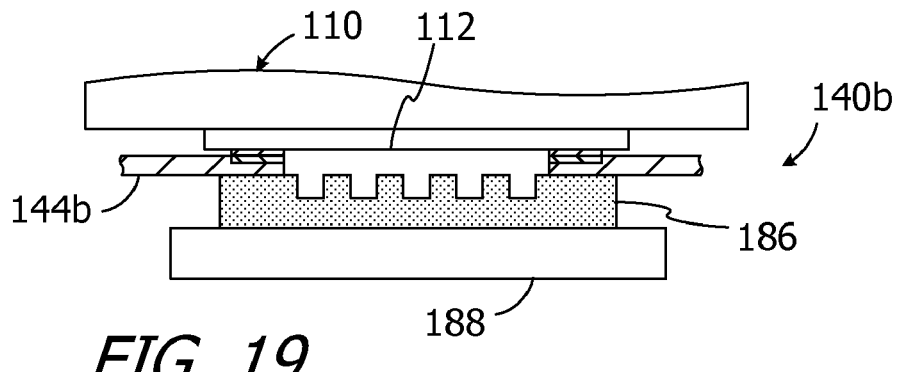

Another cleaning station that removes curable liquid residue from a patterned template with adhesive forces is generally represented by reference numeral 140b in FIGS. 18 and 19. Here, a soft adhesive pad 186 is carried by a support 188 that is located below the template opening 146b in the housing 144b. The patterned template 112 is brought into contact with the adhesive pad 186 during a cleaning procedure. The softness of the adhesive pad 186 will allow the adhesive pad to conform to the surface of the patterned template 112 in the manner illustrated in FIG. 19 and the adhesive will cause curable liquid residue on the patterned template to stick to the adhesive pad. To that end, the tackiness of the adhesive should be such that the curable liquid residue will stick to the adhesive pad 186 when the patterned template is pulled away from the adhesive pad. Here too, the presence of release agent on the patterned template 112 will enhance the removal process.

The exemplary adhesive pad 186 is slightly larger in size, in the x and y-directions, than the patterned template 112 and periodic replacement will be required. In other implementations, the adhesive pad may be provided in roll form. For example, an adhesive pad supply reel may be provided on one side of the support 188 and take up reel may be provided on the other side. The adhesive pad would be advanced, from the supply reel to the take up reel, as necessary.

The exemplary cleaning station 140b may also be provided with a second template opening and an oxygen plasma source or a water plasma source (not shown). Here too, the plasma source will be used to remove release agent from the patterned template 112.

Figure 20:
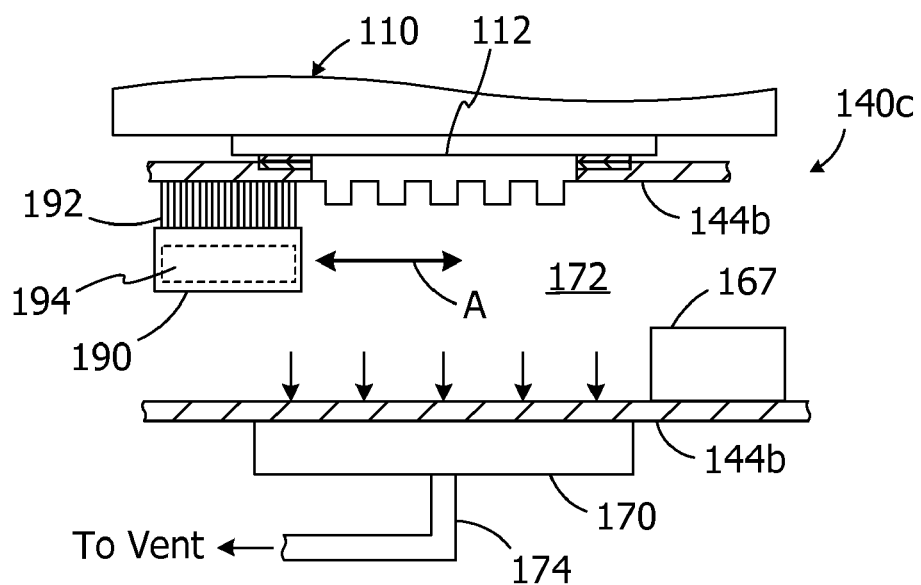
FIG. 20 is a side, partial section view of a cleaning station in accordance with one embodiment of a present invention.

Another exemplary cleaning station that may be incorporated into a template service apparatus is generally represented by reference numeral 140c in FIG. 20. The cleaning station 140c removes curable liquid residue from the patterned template 112 with mechanical (i.e. scraping) forces. More specifically, and although other devices that scrape curable liquid residue from a patterned template may be employed, the exemplary cleaning station 140c includes a brush 190 with bristles 192 and an ultrasonic vibrator 194 that is used to vibrate the bristles. Carbon nano-tubes are one example of suitable bristles 192 for the brush 190. The brush 190 is moved back and forth, as indicated by arrow A, after the patterned template 112 has been positioned within the cleaning station 140c. The vibrating bristles 192 will dislodge curable liquid residue from the patterned template 112. The curable liquid residue will be removed from the interior 172 of the cleaning station housing 144b by a suction device 170, and then transferred out apparatus enclosure 302 (FIG. 1) by way of a vent line 174. An oxygen plasma source 167 (or water plasma source) may also be provided to remove release agent from the patterned template 112.

Another exemplary cleaning station that may be incorporated into a template service apparatus is generally represented by reference numeral 140d in FIG. 21. The cleaning station 140d removes curable liquid residue from the patterned template 112 with a chemical bath. More specifically, and although other types of chemical baths may be employed, the exemplary cleaning station 140c includes a bath 196 with an interior region 198. The interior region 198, which is aligned with the housing template opening 146b, is connected to a cleaning solution source 200 by a supply line 202. One example of a suitable cleaning solution is an organic solvent such as methanol. One or more ultrasonic vibrators 204 are associated with the bath 196 and are used to energize the cleaning solution within the interior region 198 during cleaning procedures. A drainage line 206, which is controlled by a valve 208, is also connected to the interior region 198 of the bath 196. The drainage line 206 may be used to vent cleaning solution out of the apparatus enclosure 302 (FIG. 1) or back to the cleaning solution source 200 if the cleaning solution is to be reused. Additionally, pumps (not shown) may provided on the supply line 202 and/or the drainage line 206.

During one exemplary cleaning method involving the cleaning station 140d, the interior region 198 of the bath 196 will be filled with cleaning solution after (or before) the imprint head 110 and patterned template 112 are positioned in the manner illustrated in FIG. 21. The ultrasonic vibrators 204 will then be activated, in order to energize the cleaning solution to help dislodge the curable liquid residue from the patterned template 112, and then deactivated in order to allow particles and other curable liquid residue to settle at or near the bottom of the interior region. The cleaning solution will then be drained by way of the drainage line 206 and valve 208, and the imprint head 110 and patterned template 112 removed from the cleaning station 140d.

The exemplary cleaning station 140d also includes a second template opening 146b. An oxygen plasma source 167 (or water plasma source), which may be used to remove release agent from the patterned template 112, is associated with the second template opening 146b.

Although the present inventions are not limited to any particular apparatus for, or method of, re-supplying release agent to the patterned template 112, the exemplary release agent re-supply station 142 illustrated in FIGS. 22 and 23 employs a release agent bath into which the patterned template 112 is dipped. More specifically, the exemplary re-supply station 142 includes a bath 210 and with an interior region 212. The interior region 212, which is aligned with the housing template opening 146c, is connected to a release agent source 214 by a supply line 216. One example of a suitable release agent is 1H,1H,2H,2H-Perfluorodecyl-trichlorosilane. A drainage line 218, which is controlled by a valve 220, is also connected to the interior region 212 of the bath 210. The drainage line 218 may be used to vent release agent out of the apparatus enclosure 302 (FIG. 1) or back to the release agent source 214 if the release agent is to be reused. Additionally, pumps (not shown) may provided on the supply line 216 and/or the drainage line 218.

During one exemplary re-supply method involving the release agent re-supply station 142, the interior region 212 of the bath 210 will be filled with release agent before the imprint head 110 and patterned template 112 are positioned in the manner illustrated in FIG. 23. In other words, the patterned template 112 will simply be dipped into the release agent. The patterned template 112 will then be removed from the bath 210 with a release agent layer 221 thereon (FIG. 23A). The release agent may then be drained form, or allowed to remain in, the bath 210. In an alternative re-supply method, the release agent will be supplied to the bath 210 after the patterned template 112 is in the position illustrated in FIG. 23 and will be removed from the bath prior to the withdrawal of the patterned template from the re-supply station 142.

Figure 24:
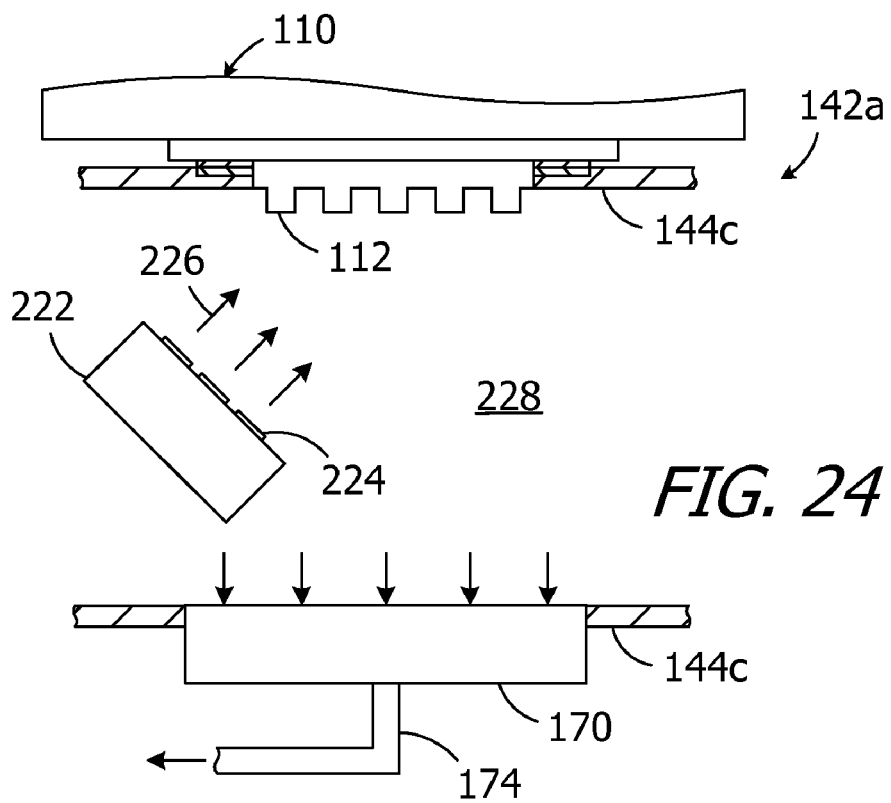
FIG. 24 is a side, partial section view of a release agent re-supply station in accordance with one embodiment of a present invention.

Another exemplary release agent re-supply station that may be incorporated into a template service apparatus is generally represented by reference numeral 142a in FIG. 24. Here, the release agent is supplied to the patterned template 112 by a spray device 222 with a plurality of nozzles 224 that spray droplets of a release agent/solvent mixture 226 at the patterned template 112. The nozzles 224 in the illustrated embodiment are oriented at approximately 45 degrees relative to the patterned template 112. This orientation may, however, vary from 0 degrees to 90 degrees as applications require. The exemplary release agent re-supply station 142a is also provided with a suction device 170 that draws excess release agent/solvent mixture 226 from the interior 228 of the re-supply station housing 144c. This mixture is then transferred out of the apparatus enclosure 302 (FIG. 1), or returned to the spray device 222, by way of a vent line 174.

Figure 25:
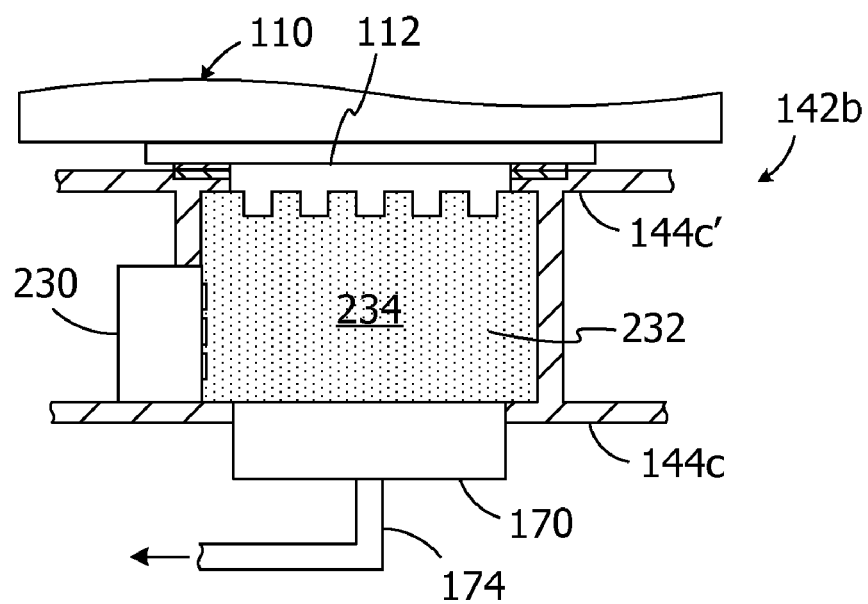
FIG. 25 is a side, partial section view of a release agent re-supply station in accordance with one embodiment of a present invention.

Another exemplary release agent re-supply station that may be incorporated into a template service apparatus is generally represented by reference numeral 142b in FIG. 25. Here, the release agent is supplied to the patterned template 112 in vapor form. The vapor may include release agent alone, or a mixture of water and release agent, which are collectively "release agent vapor." In either case, vaporizer (such as a nozzle-based vaporizer) 230 may be used to supply release agent vapor 232 to a chamber 234 within the re-supply station housing 144c'. The release agent vapor 232 will coalesce on the patterned template 112 to form a release agent layer. A suction device 170 removes excess release agent vapor 232, including any condensate, from the chamber 234. The excess release agent is then transferred out of the apparatus enclosure 302 (FIG. 1), or returned to the vaporizer 230, by way of a vent line 174.

Figure 26:
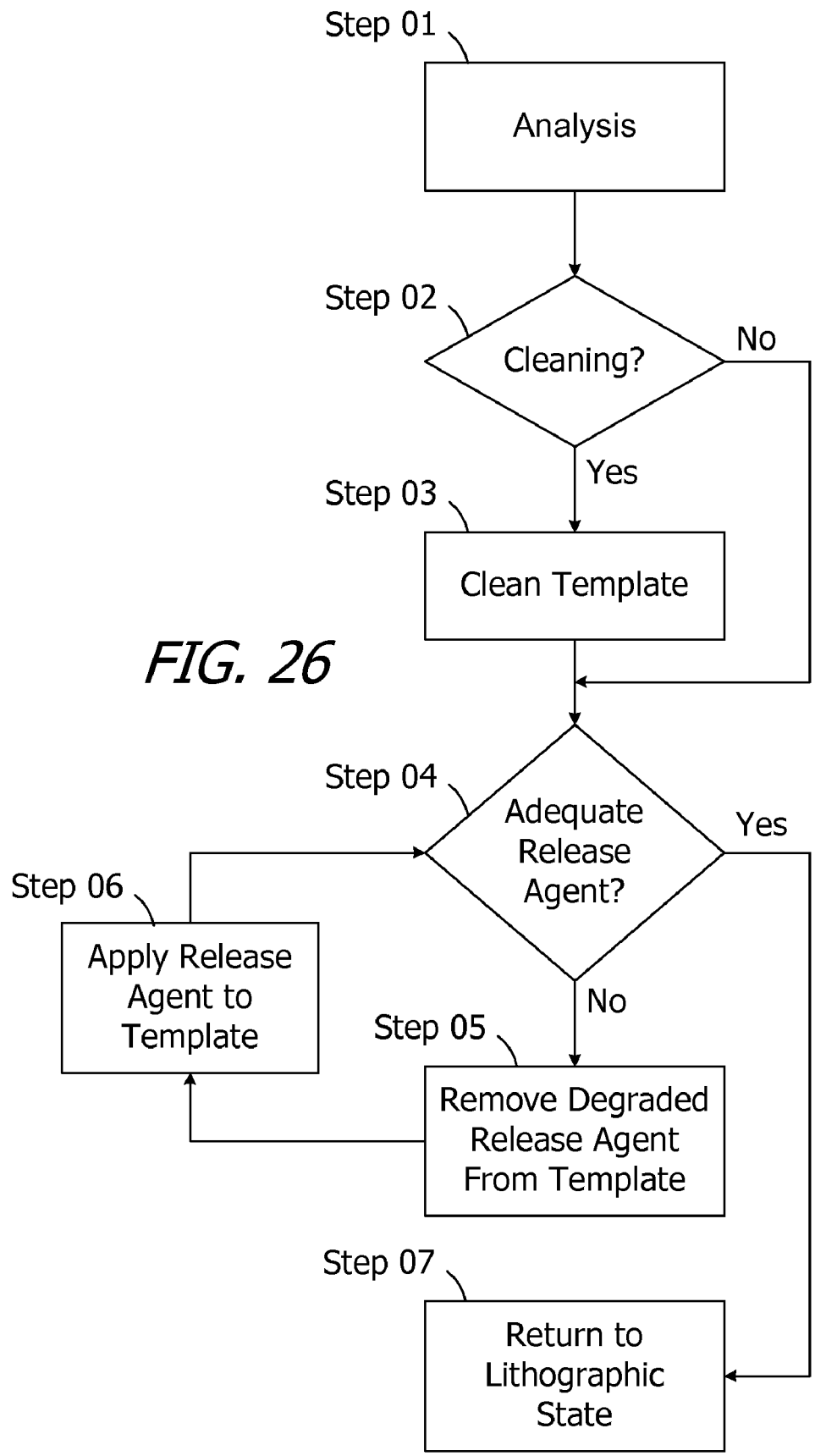
FIG. 26 is a flow chart of a method in accordance with one embodiment of a present invention.

As illustrated for example in FIG. 26, one exemplary method of servicing a patterned template includes the initial step of analyzing the patterned template (Step 01). Such an analysis, which may include determining whether or not the patterned template requires cleaning and/or the current state of the release agent layer on the patterned template, may be performed periodically as a regular portion of a step and repeat process (e.g. after every 100 imprints). Alternatively, or in addition, the analysis may take place while a new substrate is being placed in the substrate chuck 106 and/or in response to an operator command.

The patterned template 112 and the analysis station 138 are brought together while the patterned template remains within the imprint lithography apparatus 100 and, in particular, while the patterned template remains secured to the imprint head 110. As such, analysis of the patterned template 112 may take place without the delays associated with removing the patterned template from the imprint lithography apparatus 100 in general, and from the imprint head 110 in particular. In the illustrated embodiment, the motion stage 116 (FIGS. 1 and 2) and the z-direction movement apparatus 124 are used to move the imprint head 110 from an initial the position (e.g. the position illustrated in FIGS. 1 and 2) to the analysis position at the analysis station 138 illustrated in FIG. 13.

The patterned template 112 is analyzed to determine whether or not cleaning is required (Step 01). This analysis may, for example, be accomplished in the manner described above in the context of FIG. 13. Should cleaning be required (Step 02), the motion stage 116 and the z-direction movement apparatus 124 may be used to move the imprint head 110 from the analysis position at the analysis station 138 to the cleaning position at the cleaning station 140 illustrated in FIG. 14, or to the cleaning position at one of the other cleaning stations 140a-140d. The patterned template 112 will then be cleaned (Step 03) in, for example, one of the manners described above in the context of FIGS. 14-21. In some instances, the patterned template may be returned to the analysis station 138 and re-analyzed (Step 01) after the cleaning process is complete in order to insure that the curable liquid residue was successfully removed from the patterned template 112. The patterned template 112 will be re-cleaned (Step 03) if necessary.

The release agent layer will also be analyzed at the analysis station 138 to determine whether or not release agent should be re-supplied to the patterned template (Step 01). The measurement process described above in the context of FIG. 13 may be used to quantify the degradation of the release agent layer. In addition to determining whether or not the release agent should be re-supplied immediately, the determination step also includes determining whether or not the remaining release agent will last for a subsequent imprint period (e.g. 100 imprints). If it has been determined that the release agent on the patterned temple 112 is degraded to such an extent that immediate re-supply is required, or will not last for at least another imprint period (Step 04), the current release agent layer will be removed and the patterned template 112 re-supplied with a new layer of release agent.

More specifically, unless the patterned template 112 has already been moved to the cleaning station 140 for curable liquid residue removal, the motion stage 116 and the z-direction movement apparatus 124 may be used to move the imprint head 110 and patterned template from the analysis position at the analysis station 138 to cleaning station. The oxygen plasma source 167 may be used to remove the existing release agent from the patterned template 112 (Step 05). After the release agent has been removed from the patterned template 112, the motion stage 116 and the z-direction movement apparatus 124 may be used to move the imprint head 110 and patterned template to the release agent re-supply position at the re-supply station 142 illustrated in FIG. 23, or to the re-supply position at one of the other re-supply stations 142*a*-142*b*. The release agent will be reapplied in, for example, the manner described above in the context of FIGS. 22-25 (Step 06). The imprint head 110 and patterned template 112 may then be returned to the analysis station to measure the release agent layer and determine whether the newly supplied release agent layer is adequate (Step 01).

Finally, once it has been determined that the patterned template 112 is free of curable liquid residue, and that the layer of release agent on the patterned template is adequate, the imprint lithography apparatus may be returned to the lithographic state (Step 07). In the context of the exemplary imprint lithography apparatus 100, the motion stage 116 and the z-direction movement apparatus 124 will be used to move the imprint head 110 and patterned template 112 from the template service apparatus 136 to, for example, the imprinting position adjacent to the substrate chuck 106 illustrated in FIGS. 1 and 2. The imprinting process, e.g. a step and repeat process, may then either continue or begin.

Although the present inventions have been described in terms of the preferred embodiments above, numerous modifications and/or additions to the above-described preferred embodiments would be readily apparent to one skilled in the art. It is intended that the scope of the present inventions extend to all such modifications and/or additions.

We claim:

1. An imprint lithography apparatus, comprising:
    an imprint head having a surface on which a patterned template is attached; and
    a template service station including an opening adapted to receive the patterned template and a seal adapted to mate with the imprint head to prevent the surface of the imprint head from entering into the opening when the patterned template is received within the opening.

2. An imprint lithography apparatus as claimed in claim 1, further comprising:
    a substrate chuck located in spaced relation to the template service station; and
    a motion stage adapted to move the imprint head from a position adjacent to the substrate chuck to a position adjacent to the template service station.

3. An imprint lithography apparatus as claimed in claim 1, wherein the seal extends around the opening.

4. An imprint lithography apparatus as claimed in claim 3, wherein the imprint head includes a seal adapted to mate with the seal on the service station.

5. An imprint lithography apparatus as claimed in claim 1, wherein the template service station includes an analysis station.

6. An imprint lithography apparatus as claimed in claim 5, wherein the analysis station includes an optical system adapted to identify the presence of curable liquid residue on the patterned template and/or quantify the state of a release agent layer on the patterned template.

7. An imprint lithography apparatus as claimed in claim 6, wherein the template service station further includes a cleaning station and/or a release agent re-supply station.

8. An imprint lithography apparatus as claimed in claim 1, wherein the template service station includes a cleaning station.

9. An imprint lithography apparatus as claimed in claim 1, wherein the template service station includes a release agent re-supply station.

10. An imprint lithography apparatus, comprising:
    an imprint head having a surface on which a patterned template is attached; and
    means for servicing the patterned template while the patterned template is carried by the imprint head, wherein the means for servicing the patterned template includes an opening adapted to receive the patterned template and a seal adapted to mate with the imprint head to prevent the surface of the imprint head from entering into the opening when the patterned template is received within the opening.

11. An imprint lithography apparatus as claimed in claim 10, further comprising:
    means for bringing together the imprint head and the means for servicing the patterned template.

* * * * *